(12) United States Patent
Hashimoto et al.

(10) Patent No.: US 10,436,853 B2
(45) Date of Patent: Oct. 8, 2019

(54) FAILURE DETECTION APPARATUS

(71) Applicant: Panasonic Intellectual Property Management Co., Ltd., Osaka (JP)

(72) Inventors: Daichi Hashimoto, Saitama (JP); Takashi Nakazawa, Kanagawa (JP); Haruhiko Sekino, Kanagawa (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 123 days.

(21) Appl. No.: 15/707,506

(22) Filed: Sep. 18, 2017

(65) Prior Publication Data

US 2018/0003775 A1    Jan. 4, 2018

Related U.S. Application Data

(63) Continuation of application No. PCT/JP2016/001131, filed on Mar. 2, 2016.

(30) Foreign Application Priority Data

Apr. 3, 2015  (JP) ................................ 2015-076850

(51) Int. Cl.
*G01R 31/396* (2019.01)
*G01R 19/00* (2006.01)
*H01M 10/48* (2006.01)
*H02J 7/02* (2016.01)
*G01R 31/44* (2006.01)
*H02J 7/00* (2006.01)
*B60L 3/00* (2019.01)
*B60L 58/21* (2019.01)

(52) U.S. Cl.
CPC .......... *G01R 31/396* (2019.01); *B60L 3/0069* (2013.01); *B60L 58/21* (2019.02); *G01R 19/00* (2013.01); *G01R 31/44* (2013.01); *H01M 10/48* (2013.01); *H01M 10/482* (2013.01); *H02J 7/0021* (2013.01); *H02J 7/02* (2013.01); *B60L 2240/547* (2013.01); *Y02T 10/7005* (2013.01); *Y02T 10/7055* (2013.01); *Y02T 10/7061* (2013.01)

(58) Field of Classification Search
CPC ........................ H01M 10/482; H01M 10/4264
See application file for complete search history.

(56) References Cited

U.S. PATENT DOCUMENTS

2009/0128158 A1*  5/2009  Kawai .................. B60L 3/0046
                                                              324/433

FOREIGN PATENT DOCUMENTS

JP    2002-281681 A    9/2002
JP    2008-079415 A    4/2008

OTHER PUBLICATIONS

International Search Report of PCT application No. PCT/JP2016/001131 dated Apr. 19, 2016.
(Continued)

*Primary Examiner* — Olatunji A Godo
(74) *Attorney, Agent, or Firm* — Seed IP Law Group LLP

(57) ABSTRACT

A failure in any of first switches is determined based on a voltage value of a battery assembly and a predetermined threshold. The voltage value is retained in a capacitor by turning on or off the first switches and a second switch, and obtained from a voltage detector a voltage value.

8 Claims, 4 Drawing Sheets

(56) References Cited

OTHER PUBLICATIONS

English Translation of Chinese Search Report dated Mar. 5, 2019 for the related Chinese Patent Application No. 201680018551.8.
English Translation of the First Office Action dated Mar. 5, 2019 for the related Chinese Patent Application No. 201680018551.8.

* cited by examiner

FIG. 3

|      | V1          | V2           |
|------|-------------|--------------|
| SW1  | E1          | E2+0.5 × E1  |
| SW2  | E1          | 0.5 × E2     |
| SW3  | 0.5 × E1    | E2           |
| SW4  | E1+0.5 × E2 | E2           |

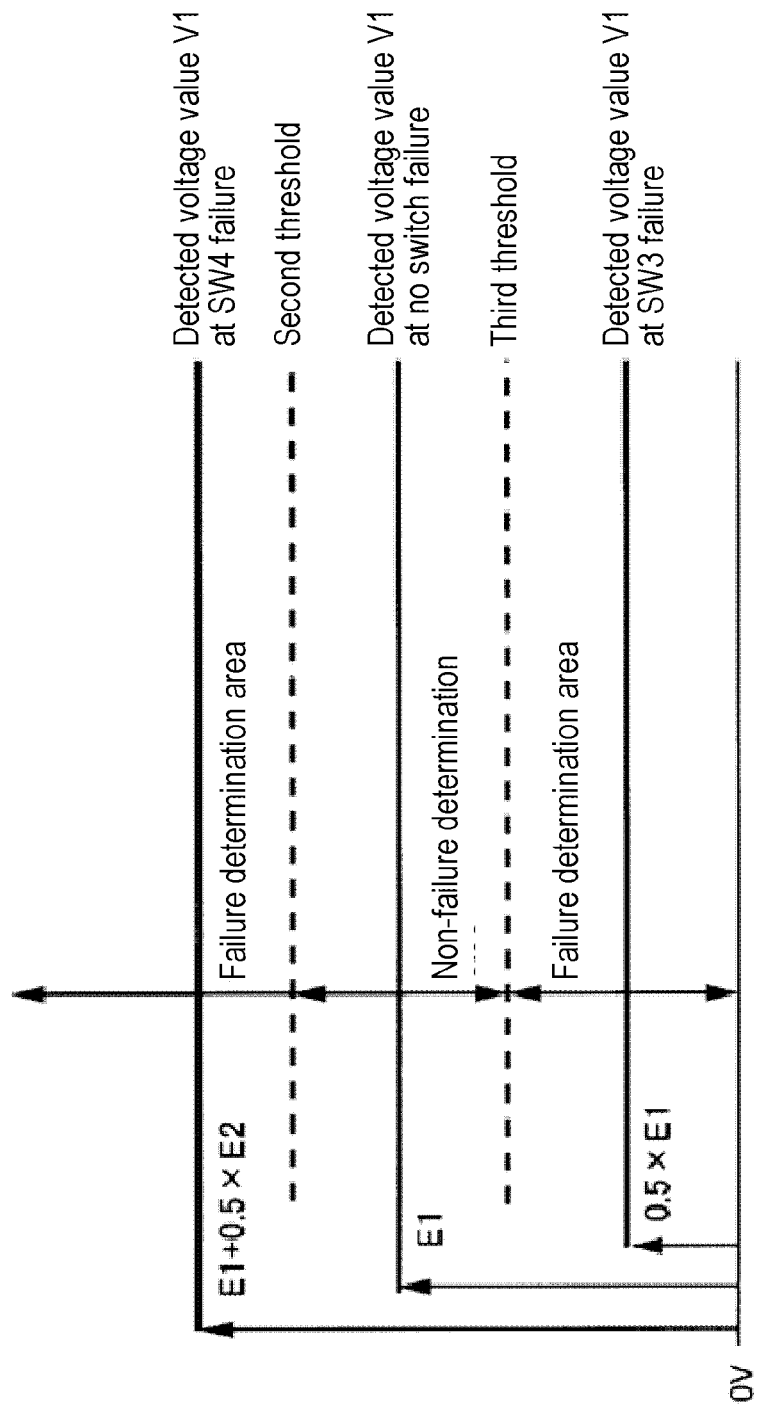

FAILURE DETECTION APPARATUS

CROSS-REFERENCE TO RELATED APPLICATIONS

This application is a continuation of the PCT International Application No. PCT/JP2016/001131 filed on Mar. 2, 2016, which claims the benefit of foreign priority of Japanese patent application No. 2015-076850 filed on Apr. 3, 2015, the contents all of which are incorporated herein by reference.

BACKGROUND

1. Technical Field

The present disclosure relates to a failure detection apparatus for detecting a short-circuit failure of a switch in a device for monitoring total voltage of a battery assembly configured of connected single cells.

2. Description of the Related Art

The use of EVs (electric vehicles) and PHEYs (plug-in hybrid electric vehicles) as electric cars that travel by rotating a motor with electric power charged to secondary batteries has been spreading. In addition, a fuel cell vehicle that adopts fuel cells using oxygen and hydrogen has been developed. Secondary batteries of electric vehicles and fuel cells of fuel cell vehicles are battery assemblies in which multiple single cells are connected in series.

In electric vehicles and fuel cell vehicles, monitoring of the total voltage of a battery assembly is important for confirming the state of the battery assembly. For this purpose, in general, a total voltage value monitoring circuit is provided in the battery assembly. When a short-circuit failure occurs in an analog switch of this total voltage value monitoring circuit, a malfunction may occur, such as overheating of a short circuit and inaccurate detection of total voltage value. Accordingly, a short-circuit failure in the total voltage value monitoring circuit needs to be found promptly.

Japanese Patent Unexamined Publication No. 2002-281681 (hereinafter, referred to as PTL1) discloses a prior art for finding a short-circuit failure in the total voltage value monitoring circuit.

SUMMARY

A failure detection apparatus of the present disclosure includes a battery voltage measuring unit, a capacitor, a voltage detector, a second switch, and a failure determiner. The battery voltage measuring unit is configured to measure a voltage value of each of the predetermined number of single cells connected in series to configure a battery assembly. The plurality of single cells is divided into at least two groups. Each of at least four first switches has a first end and a second end, the first end is connected to one of the terminals of the two of single cells configuring each of the at least two groups, and the two of the single cells are located at the both ends of each of the at least two groups. The capacitor is connected to the second end of each of the at least four first switches, and can retain a total voltage of the single cells configuring each of the at least two groups. The voltage detector is configured to detect a voltage retained by the capacitor. The second switch is disposed between one of both terminals of the capacitor and the voltage detector. The failure determiner is configured to determine whether or not any of the at least four first switches has a failure, based on a predetermined threshold and the total voltage of the single cells in each of the at least two groups. The total voltage is retained in the capacitor and obtained from the voltage detector by combinations of on-or-off states of the at least four first switches and the second switch. The predetermined threshold includes a first threshold determined based on a totalized voltage value of the single cells in each of the at least two groups and a voltage value detected by the voltage detector when any of the at least four first switches has a failure. The totalized voltage is calculated by adding a voltage value of each of the single cells measured by the battery voltage measuring unit.

The present disclosure can offer a failure detection apparatus that can accurately detect a switch short-circuit failure with less influence of voltage variations and time fluctuation of each of the single cells.

BRIEF DESCRIPTION OF DRAWINGS

FIG. 3 is a table for identifying a switch with a short-circuit failure, based on a detected voltage value and a measured totalized voltage value.

FIG. 4 is a chart illustrating an example of a threshold setting method.

DETAILED DESCRIPTION OF PREFERRED EMBODIMENTS

Prior to describing an exemplary embodiment of the present disclosure, disadvantages of a conventional apparatus are briefly described.

The apparatus according to the technology disclosed in PTL1 includes a voltage value detection circuit and a multiplexer. The voltage value detection circuit includes a differential voltage value detection circuit configured to detect a potential difference between a pair of input terminals. The multiplexer has sampling switches that individually connect an electrode terminal of each of battery modules, which are connected in series to each other, to an input terminal of the differential voltage value detection circuit. It is determined that there may be a closing failure (short-circuit failure of the sampling switches) when an output voltage value of the differential voltage detection circuit in a state where only one of the sampling switches is electrically connected is out of an appropriate range close to 0 V, or when a measured voltage value of any of the battery modules is a predetermined abnormal value.

However, single cells configuring a battery assembly may not have exactly the same voltage. There is a voltage variation among the single cells. Accordingly, in the technology disclosed in PTL1, a failure may not be accurately determined due to the variation among the single cells. In addition, it takes time to measure voltage values in some degree due to a time constant of a peripheral circuit that includes the sampling switches when the number of single cells configuring the battery assembly is large. When a voltage of each single cell changes during measurement, deviation occurs in time fluctuation until measurement in the technology disclosed in PTL1. This deviation may result in inaccurate failure determination.

The present disclosure aims to offer a failure detection apparatus that has less influence of voltage variation among single cells and time fluctuation, and can accurately detect a short-circuit failure of switches.

Figure 1:
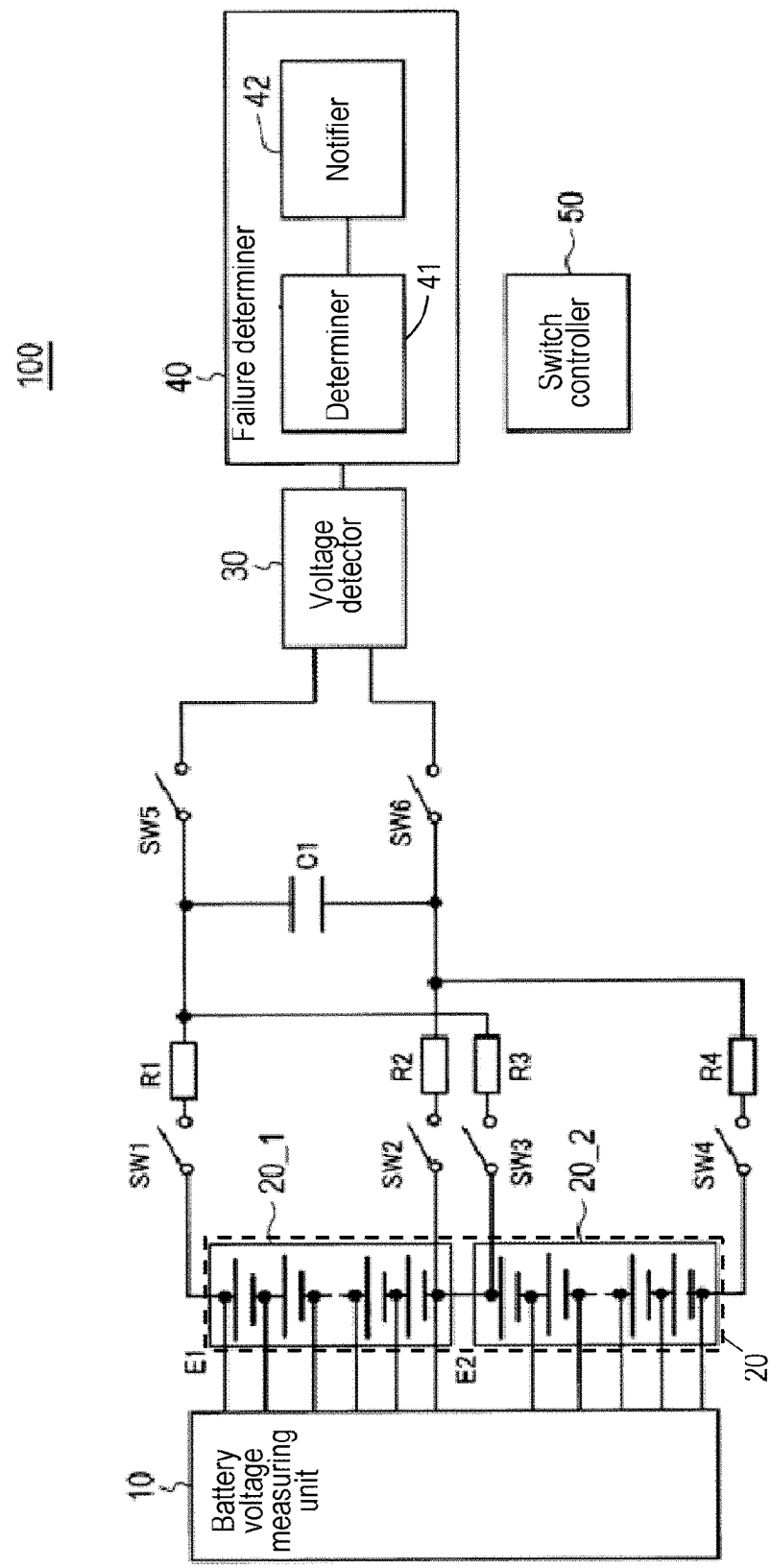
FIG. 1 is a configuration example of a failure detection apparatus in accordance with an exemplary embodiment of the present disclosure.

An exemplary embodiment of the present disclosure is detailed hereinafter. FIG. 1 is a configuration example of failure detection apparatus 100 according to the exemplary embodiment of the present disclosure. Failure detection apparatus 100 is an apparatus for detecting a switch short-circuit failure in batteries mounted typically in electric vehicles and fuel cell vehicles and a total voltage monitoring circuit for monitoring voltage of the batteries.

As shown in FIG. 1, failure detection apparatus 100 includes battery voltage measuring unit 10, voltage detector 30, failure determiner 40, switch controller 50, switches SW5 and SW6, and capacitor C1.

Battery voltage measuring unit 10 measures voltage of each of the single cells configuring battery assembly 20. Battery assembly 20 is configured of single cells connected in series. Each of the single cells is a secondary battery or a fuel cell. Examples of secondary battery include a lithium-ion battery, and nickel-metal hydride battery. The number of single cells configuring battery assembly 20 is not particularly limited in the present disclosure. For example, the number of single cells is tens to hundreds.

As shown in FIG. 1, battery assembly 20 includes two battery assemblies (or battery groups) 20_1 and 20_2. Capacitor C1 that retains voltage of each of battery assemblies 20_1 and 20_2 is connected to both terminals of each of battery assemblies 20_1 and 20_2. Switches SW1 and SW2, current-limiting resistors R1 and R2 are provided between battery assembly 20_1 and capacitor C. In the same way, switches SW3 and SW4 and current-limiting resistors R3 and R4 are provided between battery assembly 20_2 and capacitor C1. Capacitor C1 retains voltage of either battery assembly 20_1 or 20_2 according to ON/OFF state of switches SW1 to SW4. Switches SW1 to SW4 are turned ON/OFF by switch controller 50 described later. Current-limiting resistors R1 to R4 are provided to avoid a sudden flow of current from battery assembly 20_1 and/or battery assembly 20_2 to capacitor C1 when switches SW1 to SW4 are turned on or a short-circuit failure occurs in capacitor C1. Switches SW1 to SW4 correspond to the first switches of the present disclosure.

Voltage detector 30 detects voltage retained in capacitor C1. Switches SW5 and SW6 are connected to capacitor C1 and voltage detector 30 therebetween. Voltage detector 30 detects the voltage retained in capacitor C1 by turning ON/OFF switches SW5 and SW under control of switch controller 50 described later. Switches SW5 and SW6 correspond to the second switches of the present disclosure. However, either switch SW5 or SW6 can be eliminated.

As shown in FIG. 1, failure determiner 40 includes determiner 41 and notifier 42. Determiner 41 determines whether or not any of aforementioned switches SW1 to SW4 has a short-circuit failure, based on a voltage value detected by voltage detector 30. Notifier 42 provides notification when determiner 41 determines that any of switches SW1 to SW4 has a short-circuit failure.

Switch controller 50 outputs predetermined ON/OFF control signals for aforementioned switches SW1 to SW6.

[Switch Failure Determination]

Figure 2:
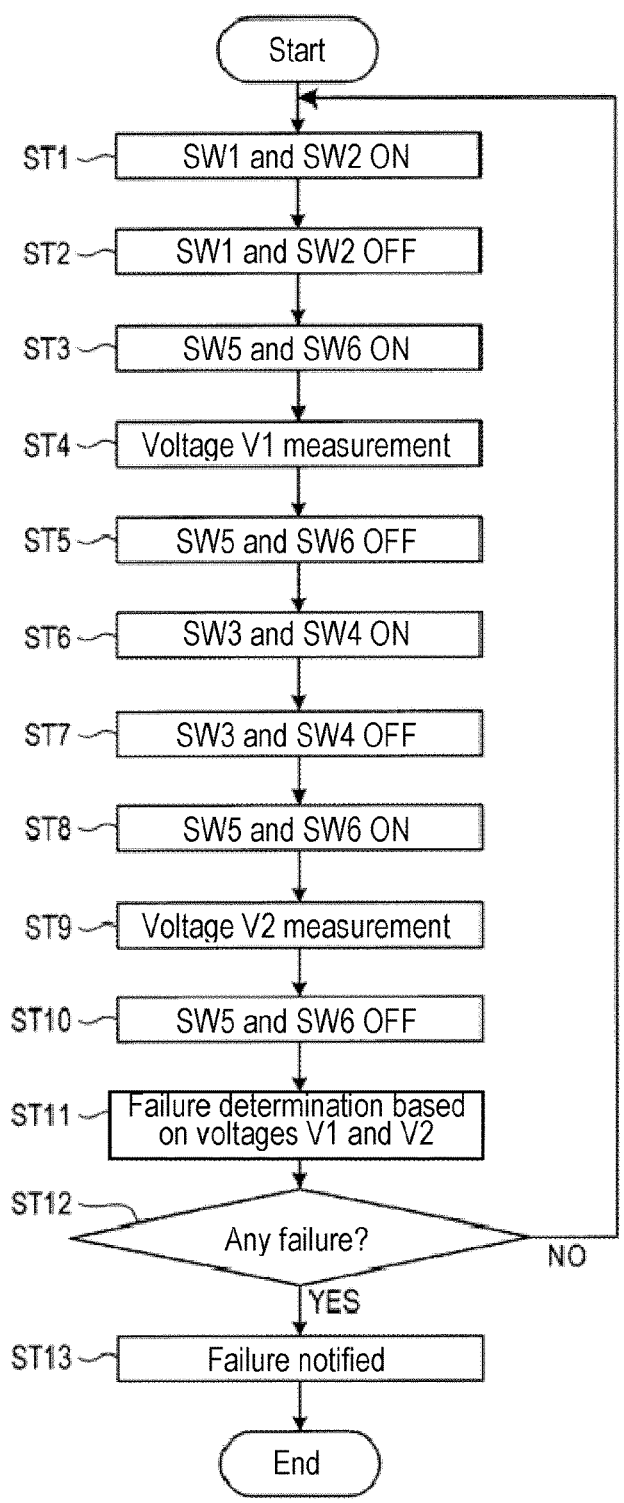
FIG. 2 is a flowchart illustrating procedures for determining a switch failure.

Procedures for determining a failure of switches SW1 to SW4 are described below with reference to FIG. 2.

Step ST1:
Switch controller 50 outputs a control signal for turning on switches SW1 and SW2. Thus, switches SW1 and SW2 are turned on, and capacitor C1 retains a voltage of battery assembly 20_1.

Step ST2:
Switch controller 50 outputs a control signal for turning off switches SW1 and SW2.

Step ST3:
Switch controller 50 outputs a control signal for turning on switches SW5 and SW6.

Step ST4:
Voltage detector 30 detects the voltage of battery assembly 20_1 retained in capacitor C1. The voltage detected in this step is hereinafter referred to as voltage V1.

Step ST5:
Switch controller 50 outputs a control signal for turning off switches SW5 and SW6.

Step ST6:
Switch controller 50 outputs a control signal for turning on switches SW3 and SW4. Thus, switches SW3 and SW4 are turned on, and capacitor C1 retains a voltage of battery assembly 20_2.

Step ST7:
Switch controller 50 outputs a control signal for turning off switches SW3 and SW4.

Step ST8:
Switch controller 50 outputs the control signal for turning on switches SW5 and SW6.

Step ST9:
Voltage detector 30 detects the voltage of battery assembly 20_2 retained in capacitor C1. The voltage detected in this step is hereinafter referred to as voltage V2.

Step ST10:
Step controller 50 outputs the control signal for turning off switches SW5 and SW6.

Step ST11:
Determiner 41 of failure determiner 40 determines whether or not a short-circuit failure has occurred in any of switches SW1 to SW4, based on voltage V1 detected in Step ST4 and voltage V2 detected in Step ST9. A determination method by determiner 41 is detailed later.

Step ST12:
If any of the switches is determined to have a short-circuit failure in Step ST11, the flow proceeds to Step ST13. If not, the flow returns to Step ST1.

Step ST13:
Notifier 42 provides notification about a switch determined to have a short-circuit failure in Step ST11. A notification method by notifier 42 is not specified in the present disclosure. For example, the notification may be made using a display device or alarm sound. Identifying which of the switches has a short-circuit failure in the notification allows that a repair work, for example, is facilitated, thereby improving ease of maintenance of failure detection apparatus 100.

[Details of Determination by Determiner 41]

Next, failure determination by determiner 41 in Step ST11, as described above, is detailed. This determination is made based on values of voltages V1 and V2 detected in aforementioned Steps ST4 and ST9, and totalized voltage values E1 and E2 of battery assemblies 20_1 and 20_2 obtained through measurements by battery voltage measuring unit 10.

Totalized voltage value E1 is a total value of voltages of all single cells configuring battery assembly 20_1, measured by battery voltage measuring unit 10. In the same way, total voltage value E2 is a total value of voltages of all single cells configuring battery assembly 20_2, measured by battery voltage measuring unit 10. In other words, if there is no fault in failure detection apparatus 100, detected voltage value V1 is equal to totalized voltage value E1 are, and detected voltage value V2 is equal to totalized voltage value E2.

FIG. 3 shows a table for identifying the switch having a short-circuit failure from voltage values V1 and V2 detected as described above (detected voltage values) and totalized voltage values E1 and E2. As shown in FIG. 3, when switch SW1 has a short-circuit failure, there is no influence of the failure at charging capacitor C1 in aforementioned Step ST1. Detected voltage value V1 is equivalent to totalized voltage value E1. On the other hand, at charging capacitor C1 in aforementioned Step ST6, detected voltage value V2 becomes E2+0.5×E1 because switches SW1, SW3, and SW4 are turned on simultaneously.

When switch SW2 has a short-circuit failure, there is no influence of the failure at charging capacitor C1 in aforementioned Step ST1, and thus detected voltage value V1 is equivalent to totalized voltage value E1. On the other hand, at charging capacitor C1 in aforementioned Step ST6, detected voltage value V2 becomes 0.5×E2 because switches SW2, SW3, and SW4 are turned on simultaneously.

When switch SW3 has a short-circuit failure, detected voltage value V1 at charging capacitor C1 in aforementioned Step ST1 becomes 0.5×E1 because switches SW1, SW2, and SW3 are turned on. On the other hand, at charging capacitor C1 in aforementioned Step ST6, there is no influence of the failure, and detected voltage value V2 is equivalent to totalized voltage value E2.

When switch SW4 has a short-circuit failure, detected voltage value V1 at charging capacitor C1 in aforementioned Step ST1 becomes E1+0.5×E2 because switches SW1, SW2, and SW4 are turned on. On the other hand, at charging capacitor C1 in aforementioned Step ST6, there is no influence of the failure, and detected voltage value V2 is equivalent to totalized voltage value E2.

Accordingly, determiner 41 detects a short-circuit failure by comparing totalized voltage value E1 of battery assembly 20_1 and totalized voltage value E2 of battery assembly 20_2 obtained by adding measured values of single cells measured by battery voltage measuring unit 10, with detected voltage values V1 and V2 that are detected values of voltages of battery assemblies 20_1 and 20_2 retained in capacitor C1 by turning on or off switches SW1 to SW4. This ensures detection of a short-circuit failure of switches SW1 to SW4 in failure detection apparatus 100.

[Detection Threshold]

The above describes the case that totalized voltage value E1 and detected voltage value V1 are equivalent, and totalized voltage value E2 and detected voltage value V2 are equivalent when there is no short-circuit failure. In other words, it is the case that no voltage variations or time fluctuation occur in single cells configuring battery assembly 20.

When there are voltage variations or time fluctuation of the single cells, totalized voltage value E1 and detected voltage value V1 may not be equivalent, and totalized voltage value E2 and detected voltage value V2 may not be equivalent. To handle these cases in failure detection apparatus 100 in the exemplary embodiment, a threshold is set, based on totalized voltage values E1 and E2 shown in FIG. 3, for making determination by aforementioned determiner 41. A short-circuit failure is determined by comparing the threshold and detected voltage values V1 and V2. Methods for setting the threshold are described below.

<Threshold Setting Method 1>

In threshold setting method 1, the first method of setting threshold of the present disclosure is described. A threshold set by threshold setting method 1 is referred to as a first threshold.

FIG. 4 illustrates threshold setting method 1. FIG. 4 shows a method of setting a threshold when either switch SW3 or SW4 is assumed to have a short-circuit failure. Straight lines in FIG. 4 for detected voltage value V1 at SW4 failure, detected voltage value V1 at no switch failure, and detected voltage value V1 at SW3 failure have values E1+0.5×x E2, E1, and 0.5×E1 shown in FIG. 3, respectively. Two dotted lines in FIG. 4 are thresholds for determining failure or non-failure. A higher threshold (referred to as a second threshold) in FIG. 4 may be set between voltage E1 that is detected when there is no switch failure and voltage E1+0.5×E2 that is detected at SW4 failure. Still more, a lower threshold (referred to as a third threshold) in FIG. 4 may be set between voltage E1 that is detected when there is no switch failure and voltage 0.5×E1 that is detected at SW3 failure.

The present disclosure does not describe specific values of thresholds to be set between voltage E1 and voltage E1+0.5× E2 and between voltage E1 and voltage 0.5×E1, respectively. For example, a threshold may be set to voltage value E1+0.25×E2 that is a median of voltage E1 and voltage E1+0.5×E2, and voltage 0.75×E1 that is a median of voltage E1 and voltage 0.5×E.

As shown in FIG. 4, when detected voltage value V1 is between 0 V and the third threshold (failure determination area in FIG. 4), determiner 41 determines that switch SW3 has a short-circuit failure. When detected voltage value V1 is between the third threshold and second threshold (non-failure determination area in FIG. 4), determiner 41 determines that none of switches SW3 and SW4 has a failure. When detected voltage value V1 is greater than the second threshold (failure determination area in FIG. 4), determiner 41 determines that switch SW4 has a short-circuit failure.

FIG. 4 shows the method of setting thresholds when switch SW3 or SW4 is assumed to have a short-circuit failure. However, thresholds for assuming that switch SW1 or SW2 has a short-circuit failure can also be determined using the same method. More specifically, a higher threshold (referred to as a fourth threshold) may be set between voltage E2 that is detected when there is no switch failure and voltage E2+0.5×E1 that is detected at SW1 failure. A lower threshold (referred to as a fifth threshold) may be set between voltage E2 that is detected when there is no switch failure and voltage 0.5×E2 that is detected at SW2 failure.

When detected voltage value V2 is between 0 V and the fifth threshold, determiner 41 determines that switch SW2 has a short-circuit failure. When detected voltage value V2 is between the fifth threshold and the fourth threshold, determiner 41 determines that none of switches SW1 and SW2 has a failure. When detected voltage value V2 is greater than the fourth threshold, determiner 41 determines that switch SW1 has a short-circuit failure.

<Threshold Setting Method 2>

In above threshold setting method 1, thresholds are set based on totalized voltage values E1 and E2 that are summed voltage values of the single cells measured by battery voltage measuring unit 10. A method described below sets thresholds that are further unlikely affected by voltage variations or time fluctuation of voltage of the single cells, based on predetermined fixed values instead of totalized voltage values E1 and E2 that are measured values.

Threshold setting method 2 describes how to set the sixth and seventh thresholds of the present disclosure. In threshold setting method 2, the maximum allowable voltage value and the minimum allowable voltage value of battery assemblies 20_1 and 20_2 are used as predetermined fixed values. More specifically, this method uses the minimum voltage value and the maximum voltage value of battery assemblies 20_1 and 20_2 installed in, for example, an electric vehicle or fuel cell vehicle that are needed for operating the electric vehicle or fuel cell vehicle. Hereinafter, the minimum voltage value of battery assembly 20_1 is referred to as minimum operating voltage value Emin1, and the maximum voltage value is referred to as maximum operating voltage value Emax1.

Threshold setting method 2 sets thresholds based on minimum operating voltage value Emin1 and maximum operating voltage value Emax1. More specifically, for example, a higher threshold (referred to as a sixth threshold) may be 0.25×Emax1, and a lower threshold (referred to as a seventh threshold) may be 0.25×Emin1. When detected voltage value V1 is between 0 V and the seventh threshold, determiner 41 determines that switch SW3 has a short-circuit failure. When detected voltage value V1 is between the seventh threshold and the sixth threshold, determiner 41 determines that none of switches SW3 and SW4 has a failure. When detected voltage value V1 is greater than the sixth threshold, determiner 41 determines that switch SW4 has a short-circuit failure. Thresholds for detected voltage value V2 may be set in the same way based on minimum operating voltage value Emin2 and maximum operating voltage value Emax2 of battery assembly 20_2.

By setting thresholds in this way, a switch failure can be reliably detected without being affected by variations or time fluctuation of voltages of the single cells configuring battery assembly 20.

The present disclosure does not particularly specify which of threshold setting method 1 and threshold setting method 2 to be used for determining a switch short-circuit failure by determiner 41. For example, when battery assembly 20 is configured with single cells with minor ignorable voltage variations and/or time fluctuation, only thresholds set according to threshold setting method 1 may be used. When battery assembly 20 is configured with single cells with relatively large voltage variations and time fluctuation, only thresholds set according to threshold setting method 2 may be used.

Alternatively, a switch short-circuit failure can be furthermore accurately determined by referring to thresholds set according to threshold setting method 1 and threshold setting method 2, and using thresholds with a narrower range (non-failure determination area) between the lower threshold and higher threshold.

As described above, failure detection apparatus 100 in the exemplary embodiment includes battery voltage measuring unit 10 and capacitor C1. Battery voltage measuring unit 10 is configured to measure a voltage value of each of a predetermined number of single cells connected in series to configure battery assembly 20. Capacitor C1 can retain a total voltage of single cells configuring each battery assembly when the single cells are divided into at least two groups (battery assemblies 20_1 and 20_2). Capacitor C1 is connected to terminals of the single cells located at both ends of each of the groups. At least four first switches SW1 to SW4 are disposed between each terminal of the single cells located at both ends of each group of the single cells (each terminal of battery assemblies 20_1 and 20_2) and capacitor C1, respectively. Failure detection apparatus 100 further includes voltage detector 30, second switches SW5 and SW6, and failure determiner 40. Voltage detector 30 is configured to detect voltage retained in capacitor C1. Each of second switches SW5 and SW6 is disposed between one of both terminals of capacitor C1 and voltage detector 30. Failure determiner 40 is configured to determine whether or not any of first switches SW1 to SW4 has a failure, based on a total voltage value and predetermined thresholds. Determiner 40 obtains from voltage detector 30 the total voltage value (voltage values of at least two battery assemblies 20_1 and 20_2) of the single cells configuring each group retained in capacitor C1 by turning on or off first switches SW1 to SW4 and second switches SW5 and SW6. The predetermined thresholds include thresholds that are determined based on a totalized voltage value of the single cells configuring each group (at least two battery assemblies 20_1 and 20_2) calculated by adding voltage values of single cells measured by battery voltage measuring unit 10, and a voltage value detected by voltage detector 30 when any of first switches SW1 to SW4 has a switch failure.

In other words, failure detection apparatus 100 in the exemplary embodiment determines a switch short-circuit failure by using thresholds determined based on the totalized voltage value of the single cells configuring each group in battery assembly 20. Accordingly, a switch short-circuit failure can be determined without being affected by voltage variations of the single cells.

Still more, failure detection apparatus 100 in the exemplary embodiment determines a switch short-circuit failure by using the sixth threshold and the seventh threshold. The sixth threshold is calculated in advance based on the maximum allowable voltage value (maximum operating voltage value) and minimum allowable voltage value (minimum operating voltage value) of one group (battery assembly 20_1), and the seventh threshold is calculated in advance based on the maximum allowable voltage value and the minimum allowable voltage value of another group (battery assembly 20_2).

More specifically, since failure detection apparatus 100 in the exemplary embodiment sets thresholds based on fixed values, a switch short-circuit failure can be determined without being affected by time fluctuation of voltage values of the single cells.

Aforementioned failure detection apparatus 100 in the exemplary embodiment of the present disclosure is just an example of the present disclosure, and thus the present disclosure may be embodied in still other ways. For example, in failure detection apparatus 100 in the above exemplary embodiment, single cells are divided into two battery assemblies 20_1 and 20_2, and capacitor C1 is connected to both terminals of each of the battery assemblies via switches SW1 to SW4. However, the present disclosure is not limited to this structure. For example, in one battery assembly configured by connecting single cells in series, these single cells may be divided into at least two groups, and a capacitor may be connected to terminals of single cells located at both ends of each group via at least four switches. Alternatively, both terminals of each of three or more battery assemblies may be connected to capacitor C1 via six or more switches. In other words, both terminals of each of battery assemblies may be connected to the capacitor via switches. Or, single cells configuring the battery assembly are divided into at least two groups, and terminals of the single cells located at both ends of each group may be connected to a capacitor to multiple switches.

The present disclosure is effectively applicable to a failure detection apparatus in a circuit for monitoring a voltage of a battery assembly, in which single cells are connected in series, installed in an electric vehicle or fuel cell vehicle.

What is claimed is:

1. A failure detection apparatus, comprising:
a capacitor;
a first switch electrically coupled between a first terminal of the capacitor and a first end of a first battery group, the first battery group being electrically coupled in series with a second battery group;
a second switch electrically coupled between a second end of the first battery group and a second terminal of the capacitor;
a third switch electrically coupled between a first end of the second battery group and the first terminal of the capacitor;
a fourth switch electrically coupled between the second end of the second battery group and the second terminal of the capacitor;
a battery voltage measuring unit configured to measure a voltage value of each of single cells in the first battery group and the second battery group;
a voltage detector configured to detect a voltage retained by the capacitor;
a fifth switch electrically coupled between one of the first or second terminals of the capacitor and the voltage detector; and
a failure determiner configured to determine whether or not any of the first switch, second switch, third switch, or fourth switch has a failure based on a predetermined threshold and a total voltage of the single cells in each of the first battery group and the second battery group, the total voltage being retained in the capacitor and detected by the voltage detector by operating the first, second, third, fourth, and fifth switches between on-or-off states,
wherein the predetermined threshold includes a first threshold determined based on a totalized voltage of the single cells in the first battery group or the second battery group and a voltage value detected by the voltage detector when any of the first switch, second switch, third switch, or fourth switch has a failure, and
the totalized voltage is calculated by adding the voltage values of the single cells of the first battery group or the second battery group measured by the battery voltage measuring unit.

2. The failure detection apparatus according to claim 1, wherein the failure determiner obtains the total voltage of the single cells in each of the first battery group and the second battery group, and identifies which of the first switch, second switch, third switch, or fourth switch has the failure based on a magnitude relation between the total voltage and the first threshold.

3. The failure detection apparatus according to claim 1, wherein the failure determiner obtains the voltage value detected by the voltage detector when the first, second, third, fourth and fifth switches are in a on or off state so as to make the capacitor retain the total voltage of the single cells in each of the first battery group and the second battery group.

4. The failure detection apparatus according to claim 1, the failure determiner is configured to obtain, from the voltage detector, a total voltage of the single cells in the first battery group in response to the two of the first, second, third and fourth switches being turned on and then turned off, and then the fifth switch being turned on, and
the failure determiner is configured to determine whether any two other switches of the first, second, third and fourth switches, has the failure based on the total voltage of the single cells in the first battery group in response and the predetermined threshold.

5. The failure detection apparatus according to claim 1, wherein the predetermined threshold includes second, third, fourth and fifth thresholds,
the second and third thresholds are determined based on a measured total voltage value of the single cells in the first battery group and a detected voltage value when at least one of the first switch and the second switch has the failure, and
the fourth and fifth thresholds are determined based on a measured total voltage value of the single cells in the second battery group and a detected voltage value when at least one of the third switch and the fourth switch has a failure.

6. The failure detection apparatus according to claim 1, wherein the predetermined threshold includes second, third, fourth and fifth thresholds,
the second threshold is determined based on a measured total voltage value of the single cells in the first battery group and a detected voltage value when the third switch has the failure,
the third threshold is determined based on the measured total voltage value of the single cells in the first battery group and a detected voltage value when the fourth switch has the failure,
the fourth threshold is determined based on a measured total voltage value of the single cells in the second battery group and a detected voltage value when the first switch has the failure, and
the fifth threshold is determined based on the measured total voltage value of the single cells in the second battery group and a detected voltage value when the second switch has the failure.

7. The failure detection apparatus according to claim 1, wherein the predetermined threshold includes second and third thresholds,
the second threshold is calculated in advance based on a maximum allowable voltage value and a minimum allowable voltage value of the first battery group, and
the third threshold is calculated in advance based on a maximum allowable voltage value and a minimum allowable voltage value of the second battery group.

8. The failure detection apparatus according to claim 1, further comprising a notification part configured to provide notification of the failure in response to the failure determiner determining that any of the first, second, third and fourth switches has the failure.

* * * * *